US012666814B2

(12) United States Patent
Yang et al.

(10) Patent No.: US 12,666,814 B2
(45) Date of Patent: Jun. 23, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Jun Yang, Wuhan (CN); Kuihua You, Wuhan (CN); Peng Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 452 days.

(21) Appl. No.: 17/289,224

(22) PCT Filed: Apr. 15, 2021

(86) PCT No.: PCT/CN2021/087354
§ 371 (c)(1),
(2) Date: Dec. 1, 2023

(87) PCT Pub. No.: WO2022/205506
PCT Pub. Date: Oct. 6, 2022

(65) Prior Publication Data
US 2024/0099083 A1      Mar. 21, 2024

(30) Foreign Application Priority Data
Mar. 31, 2021    (CN) .......................... 202110345834.6

(51) Int. Cl.
H10K 59/131      (2023.01)
H10K 59/179      (2023.01)
H10K 59/90       (2026.01)

(52) U.S. Cl.
CPC ......... H10K 59/131 (2023.02); H10K 59/179 (2023.02); H10K 59/90 (2023.02)

(58) Field of Classification Search
CPC ..... H10K 59/131; H10K 59/179; H10K 59/90
(Continued)

(56) References Cited

U.S. PATENT DOCUMENTS

| | | | | |
|---|---|---|---|---|
| 11,980,047 | B2 * | 5/2024 | Yang | ................ H10K 59/80515 |
| 12,238,980 | B2 * | 2/2025 | Zhang | .................... H10K 59/38 |

(Continued)

FOREIGN PATENT DOCUMENTS

| | | |
|---|---|---|
| CN | 207800055 U | 8/2018 |
| CN | 110649039 A | 1/2020 |

(Continued)

OTHER PUBLICATIONS

Machine_english_translation_CN_112117319_A; ShenMing et. al.; Display Device and display device bonding method; Dec. 22, 2020; EPO; whole document (Year: 2026).*

(Continued)

*Primary Examiner* — Tahseen Khan
(74) *Attorney, Agent, or Firm* — PV IP PC; Wei Te Chung

(57) ABSTRACT

The present application discloses a display panel. A thickening layer includes a first portion. An orthographic projection of a first backplate on a plane of a bonding substrate is a first projection. An orthographic projection of a circuit board on the plane of the bonding substrate is a second projection. A terminal portion includes a first region and a second region. The first region is an overlapping region of the first projection and the second projection. The first portion is disposed in the second region and extends from a junction of the first region and the second region to a side away from the first region.

20 Claims, 9 Drawing Sheets

(58) Field of Classification Search
USPC .......................................................... 428/212
See application file for complete search history.

(56) References Cited

U.S. PATENT DOCUMENTS

| | | | | |
|---|---|---|---|---|
| 12,276,888 | B2 * | 4/2025 | Gong | .................... G02F 1/1368 |
| 12,284,884 | B1 * | 4/2025 | Xiong | .................... H10K 59/60 |
| 12,394,377 | B2 * | 8/2025 | Zhang | .................. G09G 3/3233 |
| 2009/0168374 | A1 | 7/2009 | Clayton et al. | |
| 2020/0285280 | A1 * | 9/2020 | Zeng | .................... G06F 3/04164 |
| 2022/0376000 | A1 * | 11/2022 | Du | ........................ G09G 3/3233 |
| 2024/0040714 | A1 * | 2/2024 | Li | ......................... H10K 59/131 |
| 2024/0049529 | A1 * | 2/2024 | Yang | .................... H10K 59/131 |
| 2024/0172502 | A1 * | 5/2024 | Li | ........................... H10D 86/00 |
| 2024/0402542 | A1 * | 12/2024 | Zhou | ................. G02F 1/133331 |
| 2025/0089473 | A1 * | 3/2025 | Yang | .................... H10K 59/126 |
| 2025/0098475 | A1 * | 3/2025 | Yan | ......................... H10K 59/40 |
| 2025/0124875 | A1 * | 4/2025 | Zhang | .................. G09G 3/3266 |
| 2025/0143105 | A1 * | 5/2025 | Du | ......................... H10K 59/131 |

FOREIGN PATENT DOCUMENTS

| | | | | |
|---|---|---|---|---|
| CN | 110718159 A | | 1/2020 | |
| CN | 112071203 A | | 12/2020 | |
| CN | 112117319 A | * | 12/2020 | ............. H10D 86/60 |

OTHER PUBLICATIONS

International Search Report in International application No. PCT/CN2021/087354, mailed on Jan. 7, 2022.
Written Opinion of the International Search Authority in International application No. PCT/CN2021/087354, mailed on Jan. 7, 2022.

* cited by examiner

DISPLAY PANEL

RELATED APPLICATIONS

This application is a Notional Phase of PCT Patent Application No. PCT/CN2021/087354 having international filing date of Apr. 15, 2021, which claims the benefit of priority of Chinese Patent Application Nos. 202110345834.6 filed on Mar. 31, 2021. The contents of the above applications are all incorporated by reference as if fully set forth herein in their entirety.

FIELD OF INVENTION

The present application is related to the field of display technology, and specifically, to a display panel.

BACKGROUND OF INVENTION

In organic light-emitting diode (OLED) display module technology, bending terminal regions is one of key technologies to achieve a goal of narrow bezels.

During research and practice of the prior art, inventors of the present application found that as a size of a panel increases, a size of a terminal region becomes larger. When the terminal region is bent, a backplate of the terminal region is prone to wrinkling and buckling, resulting in a failure to complete bending of the terminal region or even a metal circuit breakage.

SUMMARY OF INVENTION

The present application provides a display panel that can reduce risks that a backplate of a terminal region is prone to wrinkling and buckling when the terminal region is bent.

An embodiment of the present application provides a display panel including a display portion, a terminal portion, and a bending portion connected between the display portion and the terminal portion. The terminal portion includes:

a first backplate;

a bonding substrate disposed on the first backplate;

a circuit board disposed on the bonding substrate; and a thickening layer including a first portion.

An orthographic projection of the first backplate on a plane of the bonding substrate is a first projection. An orthographic projection of the circuit board on the plane of the bonding substrate is a second projection.

The terminal portion includes a first region and a second region. The first region is an overlapping region of the first projection and the second projection.

In a first direction, the second region is connected to the first region and is disposed on a side of the first region. The first direction is parallel to a longitudinal direction of the first backplate.

The first portion is disposed in the second region and extends from a junction of the first region and the second region to a side away from the first region.

In an embodiment, the terminal portion further includes a third region. In the first direction, the third region is connected to the first region and is disposed on another side of the first region. The thickening layer further includes a second portion disposed in the third region.

The second portion extends from a junction of the first region and the third region to a side away from the first region.

Optionally, in an embodiment, the thickening layer further includes a third portion disposed in the first region and connected to the first portion.

Optionally, in an embodiment, the thickening layer further includes a fourth portion disposed in the first region and connected to the second portion.

Optionally, in an embodiment, the terminal portion further includes a third region. In the first direction, the third region is connected to the first region and is disposed on another side of the first region. The thickening layer further includes a second portion disposed in the third region.

The second portion extends from a junction of the first region and the third region to a side away from the first region.

The third portion is connected to the second portion.

Optionally, in an embodiment, a length of the first portion is less than or equal to a length of the second region.

Optionally, in an embodiment, a width of the first portion is less than or equal to a width of the first region.

Optionally, in an embodiment, from the junction of the first region and the second region to a direction away from the first region, a thickness of the first portion progressively decreases or remains constant.

Optionally, in an embodiment, a length of the thickening layer is less than or equal to a length of the first backplate.

Optionally, in an embodiment, a width of the thickening layer is less than or equal to a width of the first region.

Optionally, in an embodiment, in the first direction, from a center line of the first region to a direction away from the center line, a thickness of the thickening layer progressively decreases or remains constant.

Optionally, in an embodiment, the thickening layer is disposed on a surface of the first backplate away from the bonding substrate.

Optionally, in an embodiment, the thickening layer and the first backplate are an integrated structure.

Optionally, in an embodiment, the thickening layer is disposed on the bonding substrate.

Optionally, in an embodiment, the first portion and the second portion are disposed on the bonding substrate, and the third portion is disposed on the circuit board.

Optionally, in an embodiment, the bonding substrate includes:

a first substrate disposed on the first backplate;

a metal layer disposed on the first substrate and including a connecting terminal;

an insulating layer disposed on the metal layer and exposing the connecting terminal.

Optionally, in an embodiment, a width of the thickening layer is greater than a width of the first region and less than or equal to a width of the first backplate.

Optionally, in an embodiment, a width of the first portion is greater than a width of the first region and less than or equal to a width of the first backplate.

Optionally, in an embodiment, a width of the second portion is less than or equal to a width of the first region.

Optionally, in an embodiment, a width of the third portion is less than or equal to a width of the first region.

Optionally, in an embodiment, a width of the fourth portion is less than or equal to a width of the first region.

The present application discloses a display panel. In the display panel, the terminal portion includes a first backplate, a bonding substrate, a circuit board, and a thickening layer. The bonding substrate is disposed on the first backplate. The circuit board is disposed on the bonding substrate. The thickening layer includes a first portion. An orthographic projection of the first backplate on a plane of the bonding substrate is a first projection. An orthographic projection of the circuit board on the plane of the bonding substrate is a second projection. The terminal portion includes a first region and a second region. The first region is formed by overlapping the first projection and the second projection. In a first direction, the second region is connected to the first region and is disposed on a side of the first region. The first direction is parallel to a longitudinal direction of the first backplate. The first portion is disposed in the second region and extends from a junction of the first region and the second region to a side away from the first region. The present application disposes the thickening layer in the second region and the third region of the terminal portion, so as to reduce risks of wrinkling and buckling occurring to the first backplate.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF PREFERRED EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a skilled in the art without creative efforts fall into the protected scope of the of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

An embodiment of the present application provides a display panel, and details are described below. It should be explained that a description order of following embodiments is not intended to limit a preferred order of the embodiment.

Figure 1:
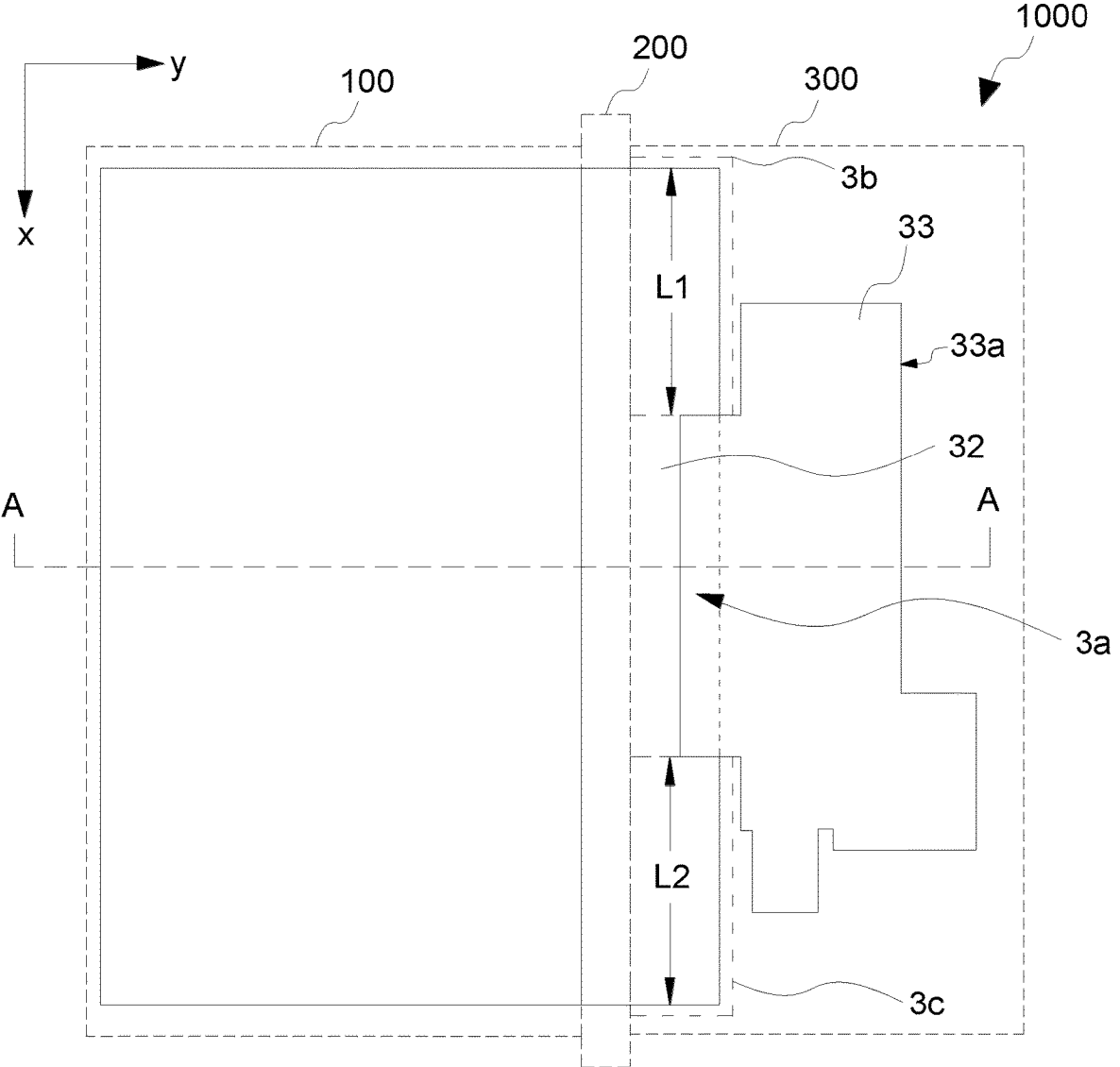
FIG. 1 is a structural schematic diagram of a top view of a display panel provided by a first embodiment of the present application in a flat state.
Figure 2:
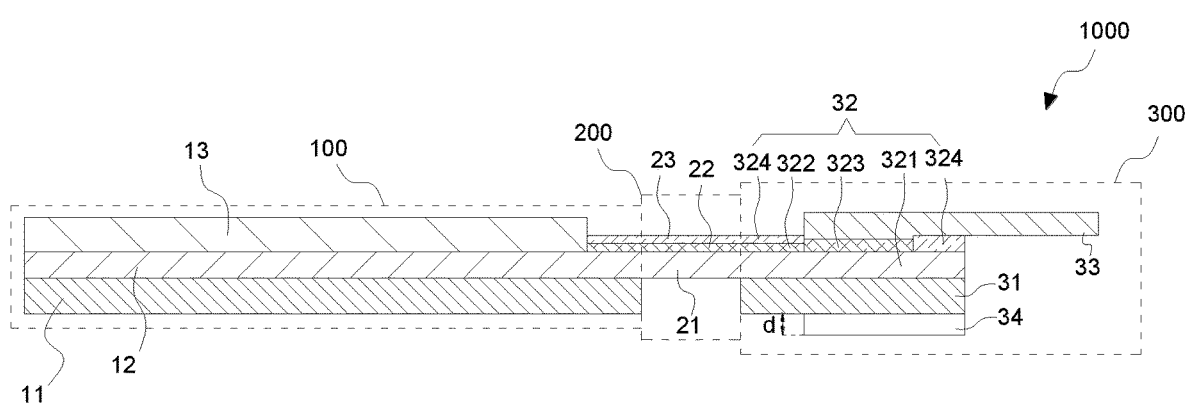
FIG. 2 is a structural schematic diagram of a cross-sectional view along line AA in FIG. 1.
Figure 3:
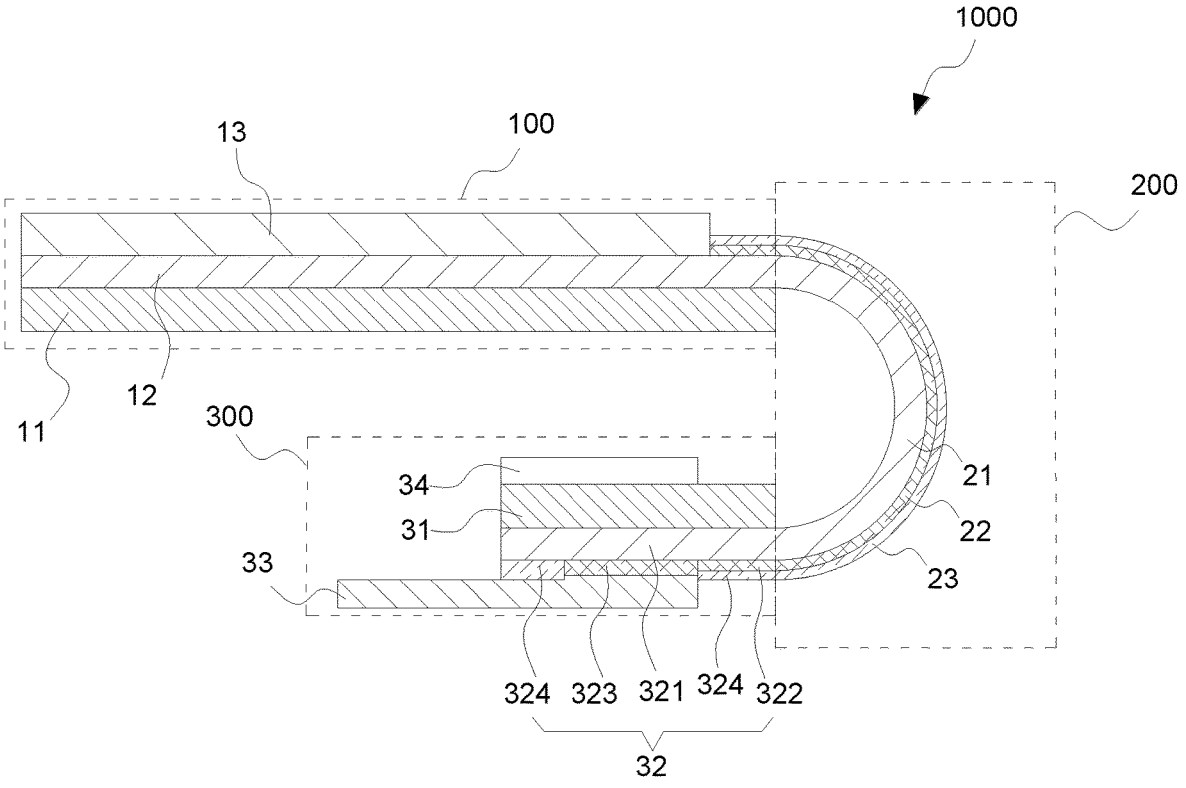
FIG. 3 is a structural schematic diagram of a cross-sectional view of the display panel provided by the first embodiment of the present application in a bending state.

Please refer to FIGS. 1-3. FIG. 1 is a structural schematic diagram of a top view of a display panel provided by a first embodiment of the present application in a flat state. FIG. 2 is a structural schematic diagram of a cross-sectional view along line AA in FIG. 1. FIG. 3 is a structural schematic diagram of a cross-sectional view of the display panel provided by the first embodiment of the present application in a bending state.

In the display panel 1000 provided by an embodiment of the present application, the display panel 1000 includes a display portion 100, a bending portion 200, and a terminal portion 300. The bending portion 200 is connected between the display portion 100 and the terminal portion 300.

The terminal portion 300 includes a first backplate 31, a bonding substrate 32, a circuit board 33, and a thickening layer 34. The bonding substrate 32 is disposed on the first backplate 31. The circuit board 33 is disposed on the bonding substrate 32. The thickening layer 34 is disposed on a surface of the first backplate 31 away from the bonding substrate 32.

Optionally, the bonding substrate 32 includes a first substrate 321, a first wire 322, a connecting terminal 323, and a first insulating layer 324. The connecting terminal 323 is connected to the first wire 322. The first wire 322 is disposed in a same layer as the connecting terminal 323 and disposed on the first substrate 321. The first insulating layer 324 covers the first wire 322 and exposes the connecting terminal 323.

Optionally, the thickening layer 34 and the first backplate 31 are an integrated structure. That is, material of the thickening layer 34 is same as material of the first backplate 31. In other words, a thickened first backplate 31 can be prepared at an incoming end, and a thickened portion is the thickening layer 34.

In an embodiment, the material of the thickening layer 34 is different from the material of the first backplate 31. Optionally, an elastic modulus of the thickening layer 34 is greater than an elastic modulus of the first backplate 31, so as to increase a suppression effect on buckling occurring to the first backplate 31.

Optionally, the circuit board 33 can be a printed circuit board or a flexible circuit board. The circuit board 33 is electrically connected to the connecting terminal 323.

The bending portion 200 includes a second substrate 21, a second wire 22, and a second insulating layer 23 arranged in sequence.

The display portion 100 includes a second backplate 11, a third substrate 12, and a display module 13 arranged in sequence. Optionally, the display module 13 can be one of an organic light-emitting diode (LED) display module, a liquid crystal display module, a micro-LED display module, or a mini-LED display module. The display panel 1000 of the first embodiment is described by taking the display module 13 as an organic light-emitting diode display module as an example, but it is not limited to this.

Optionally, the first substrate 321, the second substrate 21, and the third substrate 12 are connected in sequence, and materials of the three can be same or different. In the display panel 1000 of the first embodiment, the first substrate 321, the second substrate 21, and the third substrate 12 are integrally formed.

The first wire 322 and the second wire 22 are connected. The second wire 22 is electrically connected to the display module 13. Materials of the first wire 322 and the second wire 22 are same, and they are integrally formed. Optionally, in an embodiment, the materials of the first wire 322 and the second wire 22 can be different.

The first insulating layer 324 and the second insulating layer 23 are connected. Materials of the first insulating layer 324 and the second insulating layer 23 are same, and they are integrally formed. Optionally, in an embodiment, the materials of the first insulating layer 324 and the second insulating layer 23 can be different.

Figure 4:
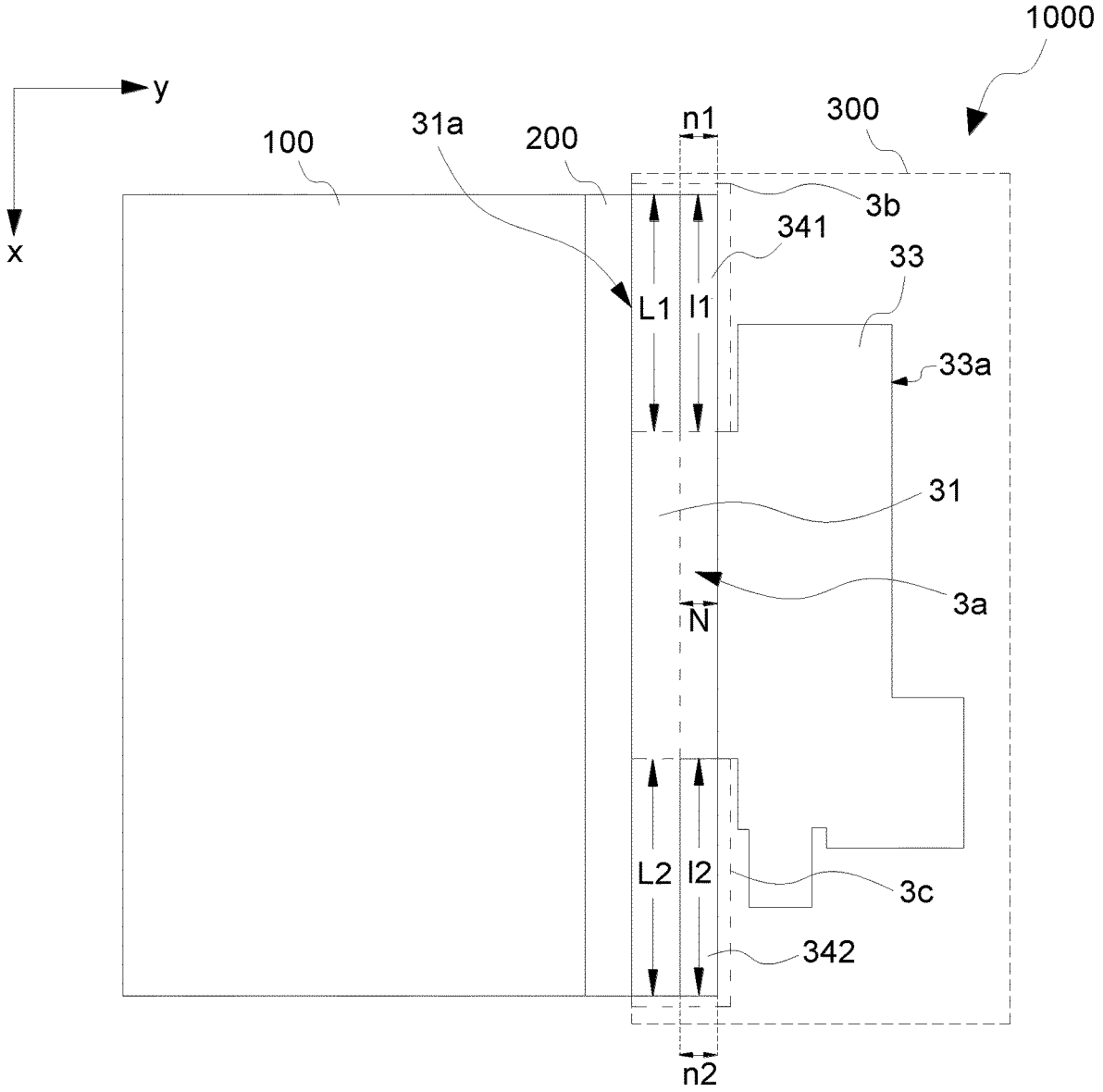
FIG. 4 is a structural schematic diagram of a bottom view of the display panel provided by the first embodiment of the present application in the flat state.

In the display panel 1000 of the first embodiment, referring to FIGS. 1 and 4, an orthographic projection of the first backplate 31 on a plane of the bonding substrate 32 is a first projection 31*a*, and an orthographic projection of the circuit board 33 on the plane of the bonding substrate 32 is a second projection 33*a*.

The terminal portion 300 includes a first region 3*a*, a second region 3*b*, and a third region 3*c*. The first region 3*a* is an overlapping region of the first projection 31*a* and the second projection 33*a*.

In a first direction x, the second region 3*b*, the first region 3*a*, and the third region 3*c* are sequentially connected. The first direction x is parallel to a longitudinal direction of the first backplate 31. In addition, a second direction y is perpendicular to the first direction x.

Specifically, the second region 3*b* is connected to the first region 3*a* and is disposed on a side of the first region 3*a*. The third region 3*c* is connected to the first region 3*a* and is disposed on another side of the first region 3*a*.

The thickening layer 34 includes a first portion 341 and a second portion 342. The first portion 341 is disposed in the second region 3*b*. The second portion 342 is disposed in the third region 3*c*.

The first portion 341 extends from a junction of the first region 3*a* and the second region 3*b* to a side away from the first region 3*a*.

The second portion 342 extends from a junction of the first region 3*a* and the third region 3*c* to a side away from the first region 3*a*.

The display panel 1000 in the first embodiment disposes the thickening layer 34 corresponding to the second region 3*b* and the third region 3*c* on the first backplate 31, so as to reduce risks of wrinkling and buckling occurring to two opposite ends of the first backplate 31.

Optionally, in the display panel 1000 of the first embodiment, a length l1 of the first portion 341 is less than or equal to a length L1 of the second region 3*b*. In the first direction x, the second region 3*b* extends from a boundary of the first region 3*a* to a boundary of the first backplate 31.

A length l2 of the second portion 342 is less than or equal to a length L2 of the third region 3*c*. In the first direction x, the third region 3*c* extends from the boundary of the first region 3*a* to another boundary of the first backplate 31.

Understandably, the first portion 341 extends from the junction of the first region 3*a* and the second region 3*b* to the side away from the first region 3*a*, the longer the length l1 of the first portion 341 is, the farther the suppression effect transmitted from a middle of the terminal portion 300 can be. As a result, a buckling degree of a portion of the first backplate 31 corresponding to the second region 3*b* becomes smaller.

The second portion 342 extends from the junction of the first region 3*a* and the third region 3*c* to the side away from the first region 3*a*. The longer the length l2 of the second portion 342 is, the farther the suppression effect transmitted from the middle of the terminal portion 300 can be. As a result, a buckling degree of a portion of the first backplate 31 corresponding to the third region 3*c* becomes smaller.

Therefore, in the display panel 1000 of the first embodiment, the length l1 of the first portion 341 is equal to the length L1 of the second region 3*b*. The length l2 of the second portion 342 is equal to the length l2 of the third region 3*c*.

In an embodiment, the lengths of the first portion 341 and the second portion 342 are different.

Optionally, a width n1 of the first portion 341 is less than or equal to a width N of the first region 3*a*. A width n2 of the second portion 342 is less than or equal to the width N of the first region 3*a*.

According to experiments, as long as the first portion 341 is disposed in the second region 3*b*, and the second portion 342 is disposed in the third region 3*c*, the buckling degree of the two opposite ends of the first backplate 31 can be relieved. When the widths of the first portion 341 and the second portion 342 are equal to the width of the first region 3*a*, an effectiveness of relieving the buckling degree of the two opposite ends of the first backplate 31 is the best.

Therefore, in the display panel 1000 of the first embodiment, the widths of the first portion 341 and the second portion 342 are equal to the width of the first region 3*a*.

In an embodiment, the width n1 of the first portion 341 is greater than the width N of the first region 3*a* and is less than or equal to the width of the first backplate 31. The width n2 of the second portion 342 is greater than the width N of the first region 3*a* and is less than or equal to the width of the first backplate 31.

In an embodiment, the widths of the first portion 341 and the second portion 342 are different.

Optionally, from the junction of the first region 3*a* and the second region 3*b* to a direction away from the first region 3*a*, a thickness d of the first portion 341 progressively decreases or remains constant.

When the thickness of the first portion 341 remains constant, the suppression effect on the buckling occurring to the first backplate 31 is better than that when the thickness of the first portion 341 progressively decreases. However, the thickness of the first portion 341 configured to progressively decrease can save material on the one hand and save space for installation of other devices on the other hand.

In the display panel 1000 of the first embodiment, from the junction of the first region 3*a* and the second region 3*b* to the direction away from the first region 3*a*, the thickness of the first portion 341 remains constant.

Optionally, from the junction of the first region 3*a* and the third region 3*c* to a direction away from the first region 3*a*, a thickness d of the second portion 342 progressively decreases or remains constant.

When the thickness of the second portion 342 remains constant, the suppression effect on the buckling occurring to the first backplate 31 is better than that when the thickness of the second portion 342 progressively decreases. However, the thickness of the second portion 342 configured to progressively decrease can save material on the one hand and save space for installation of other devices on the other hand.

In the display panel 1000 of the first embodiment, from the junction of the first region 3a and the second region 3b to a direction away from the first region 3a, the thickness of the first portion 341 remains constant. From the junction of the first region 3a and the third region 3c to the direction away from the first region 3a, the thickness of the second portion 342 remains constant.

Optionally, a thickness of the thickening layer 34 is less than 900 microns. Because a bending diameter of the bending portion 200 is approximately 900 microns, this configuration ensures that the bending portion 200 can be bent to an optimal state.

Figure 5:
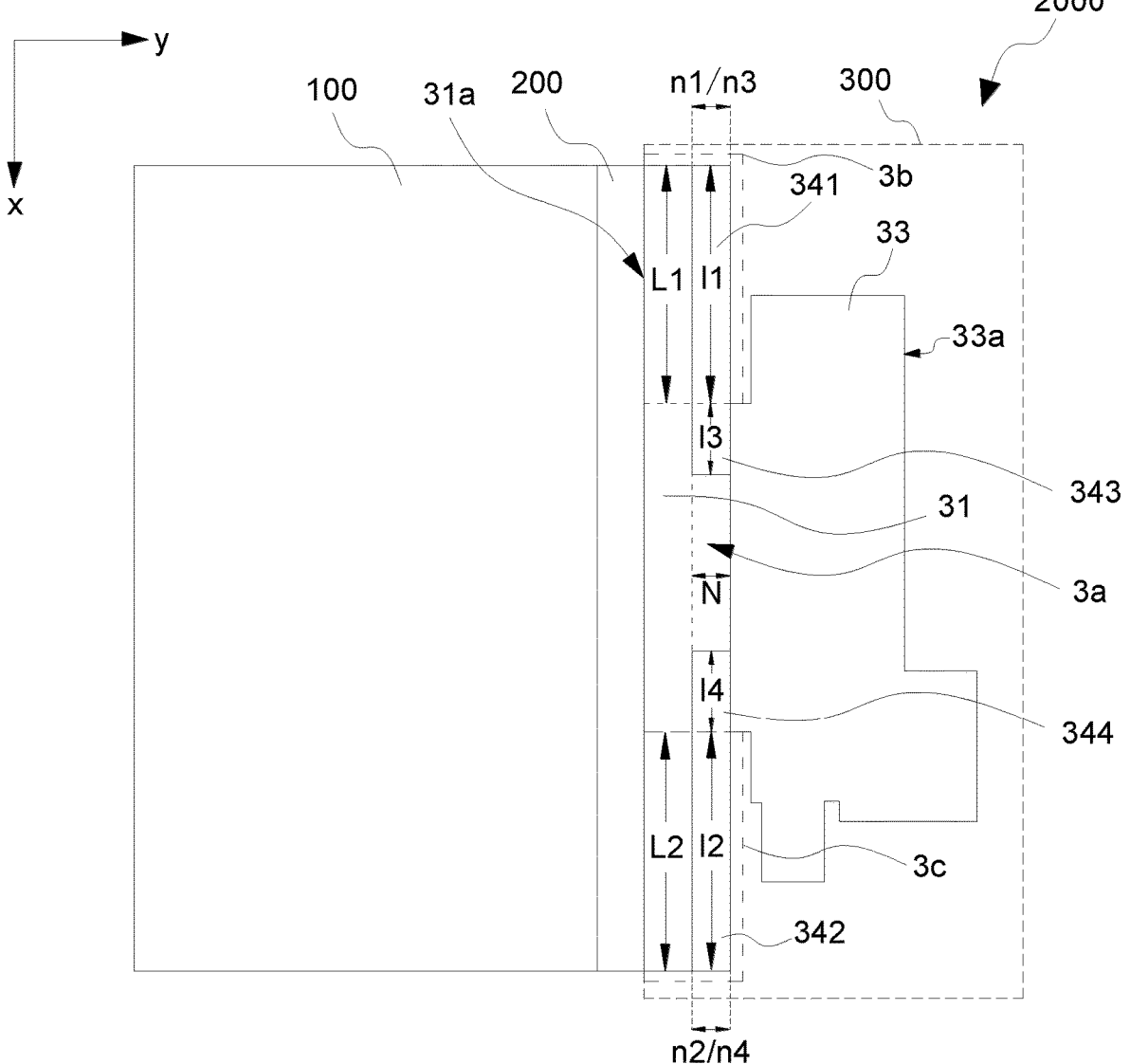
FIG. 5 is a structural schematic diagram of a bottom view of a display panel provided by a second embodiment of the present application in a flat state.

Please refer to FIG. 5. A display panel 2000 of a second embodiment has following structural features added to the display panel 1000 of the first embodiment.

The thickening layer 34 further includes a third portion 343 and a fourth portion 344. The third portion 343 is disposed in the first region 3a, and the third portion 343 is connected to the first portion 341. The fourth portion 344 is disposed in the first region 3a, and the fourth portion 344 is connected to the second portion 342.

The third portion 343 is not connected to the fourth portion 344.

The display panel 2000 of the second embodiment is provided with the third portion 343 and the fourth portion 344 to increase the suppression effect of the thickening layer 34 on the buckling occurring to the two opposite ends of the first backplate 31.

Optionally, widths n3 and n4 of the third portion 343 and the fourth portion 344 are equal to the width N of the first region 3a.

In an embodiment, the width n3 of the third portion 343 is greater than the width N of the first region 3a and is less than or equal to the width of the first backplate 31. The width n4 of the fourth portion 344 is greater than the width N of the first region 3a and is less than or equal to the width of the first backplate 31.

In an embodiment, the width n3 of the third portion 343 is less than the width N of the first region 3a. The width n4 of the fourth portion 344 is less than the width N of the first region 3a.

Optionally, a lengths 13 and 14 of the third portion 343 and the fourth portion 344 are less than the length of the first region 3a.

Optionally, thicknesses of the third portion 343 and the fourth portion 344 are equal. In an embodiment, the thicknesses of the third portion 343 and the fourth portion 344 are less than the thickness d of the first portion 341 or the second portion 342 to save space.

Optionally, materials of the first portion 341, the second portion 342, the third portion 343, and the fourth portion 344 are same.

Figure 6:
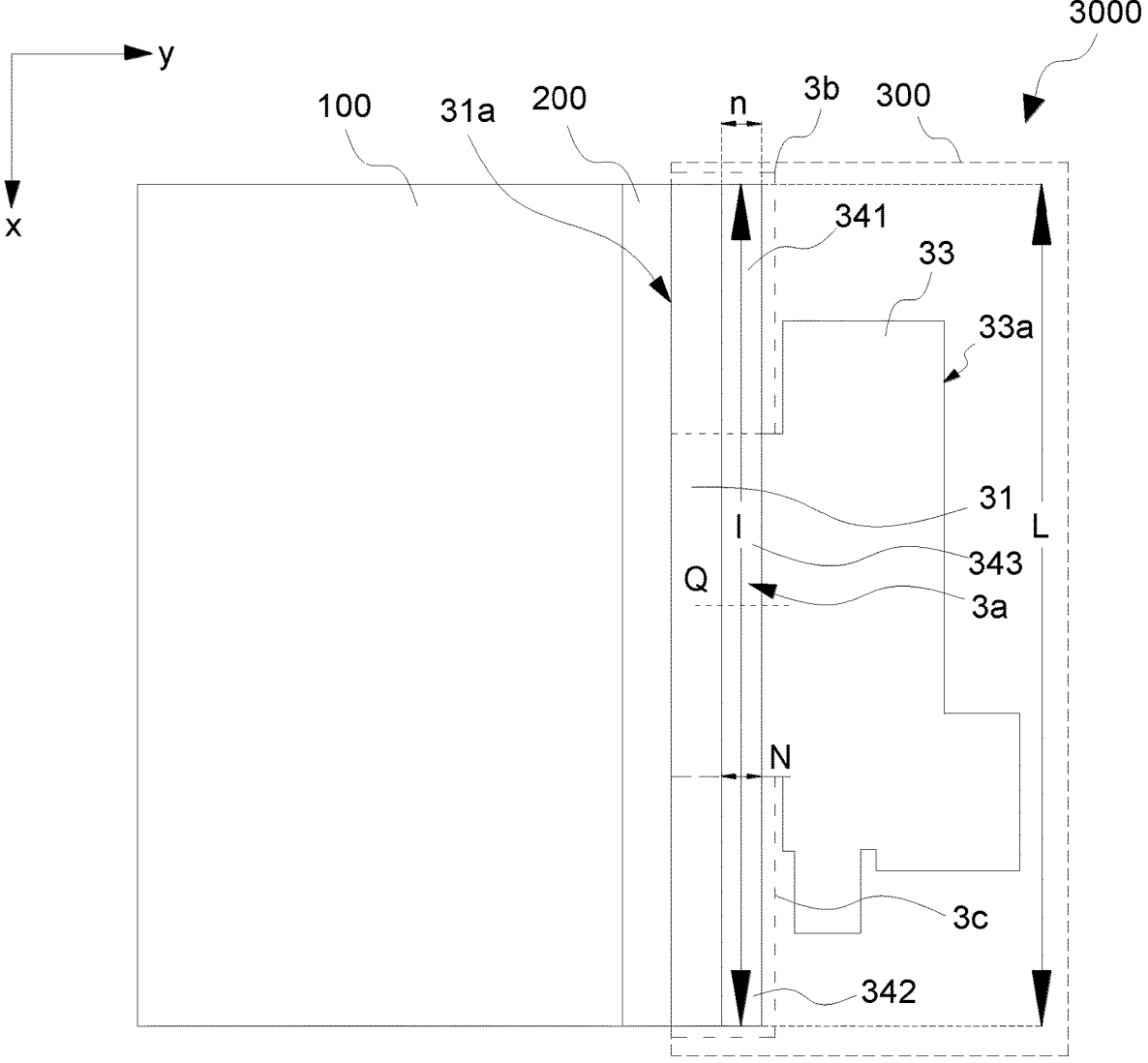
FIG. 6 is a structural schematic diagram of a bottom view of a display panel provided by a third embodiment of the present application in a flat state.

Please refer to FIG. 6. A display panel 3000 of a third embodiment has following structural features added to the display panel 1000 of the first embodiment.

The thickening layer 34 further includes a third portion 343. The third portion 343 is disposed in the first region 3a. The third portion 343 is connected to the first portion 341 and the second portion 342.

The display panel 3000 of the third embodiment is provided with the third portion 343 to increase the suppression effect of the thickening layer 34 on the buckling occurring to the two opposite ends of the first backplate 31.

Optionally, a length 1 of the thickening layer 34 is less than or equal to the length L of the first backplate 31.

The thickening layer 34 includes the third portion 343. The longer extensions of the first portion 341 and the second portion 342 are, the farther the suppression effect transmitted from the middle of the terminal portion 300 can be. As a result, a buckling degree of the two opposite ends of the first backplate 31 becomes smaller.

Therefore, in the display panel 3000 of the third embodiment, the length 1 of the thickening layer 34 is equal to the length of the first backplate 31.

Optionally, a width n of the thickening layer 34 is less than or equal to the width N of the first region 3a.

Figure 7:
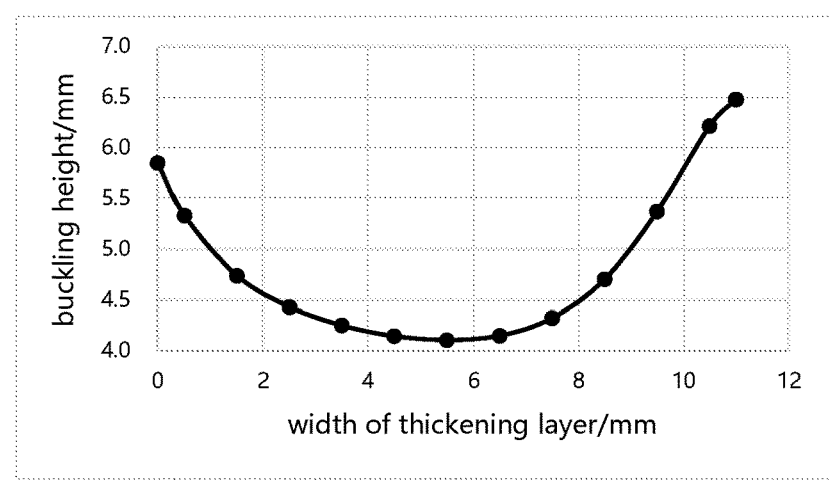
FIG. 7 is a curve diagram of a width of a thickening layer and a buckling height of a first backplate when the display panel provided by the third embodiment of the present application is in a bending state.

In the display panel 3000 of the third embodiment, the width of the first backplate 31 is 11 millimeters, and the width N of the first region 3a is 5.5 millimeters. Please refer to FIG. 7. According to experiments, under a condition that the display panel 3000 is bent, and the length 1 of the thickening layer 34 remains constant, when the width n of the thickening layer 34 ranges from 0 millimeters to 5.5 millimeters, as the width n of the thickening layer 34 increases, the thickening layer 34 has a better suppression effect on the buckling occurring to the two opposite ends of the first backplate 31; when the width n of the thickening layer 34 ranges from 5.5 millimeters to 11 millimeters, as the width n of the thickening layer 34 increases, the thickening layer 34 has a worse suppression effect on the buckling occurring to the two opposite ends of the first backplate 31.

Therefore, when the width n of the thickening layer 34 is equal to 5.5 millimeters, which means that the width of the thickening layer 34 is equal to the width N of the first region 3a, the thickening layer 34 has a best suppression effect on the buckling occurring to the two opposite ends of the first backplate 31.

In an embodiment, the width n of the thickening layer 34 is greater than the width N of the first region 3a and is less than or equal to the width of the first backplate 31.

Optionally, in the first direction x, from a center line Q of the first region 3a to a direction away from the center line Q, the thickness of the thickening layer 34 progressively decreases or remains constant.

When the thickness of the thickening layer 34 remains constant, the suppression effect on the buckling occurring to the first backplate 31 is better than that when the thickness of the thickening layer 34 progressively decreases. However, the thickness of the thickening layer 34 configured to progressively decrease can save material on the one hand and save space for installation of other devices on the other hand.

In the display panel 3000 of the third embodiment, from the center line Q of the first region 3a to the direction away from the center line Q, the thickness of the thickening layer 34 remains constant.

Optionally, the thickness of the thickening layer 34 is less than 900 microns. Because a bending diameter of the bending portion 200 is approximately 900 microns, this configuration ensures that the suppression effect on the buckling occurring to the two opposite ends of the first backplate 31 can be maximized when the bending portion 200 is bent to the optimal state.

Figure 8:
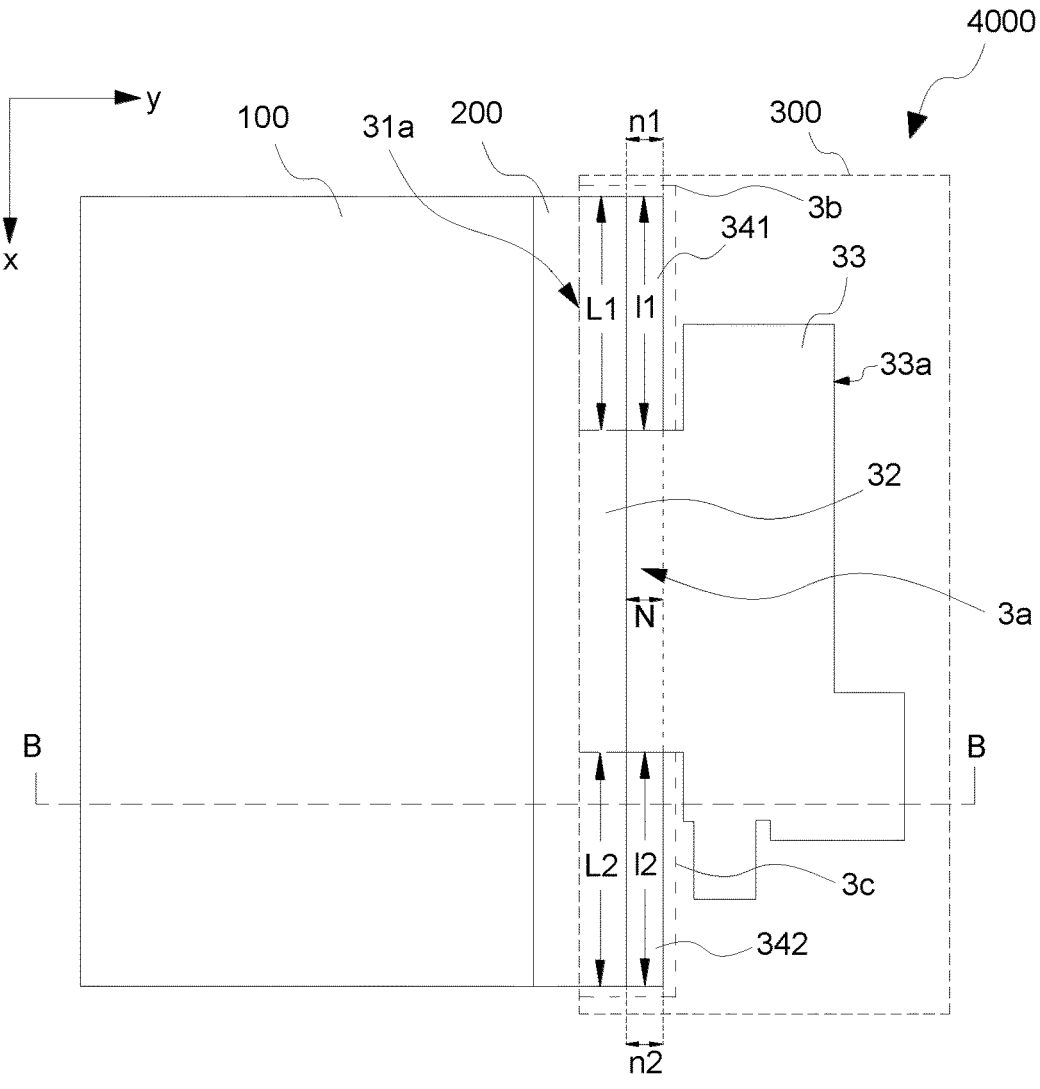
FIG. 8 is a structural schematic diagram of a top view of a display panel provided by a fourth embodiment of the present application in a flat state.
Figure 9:
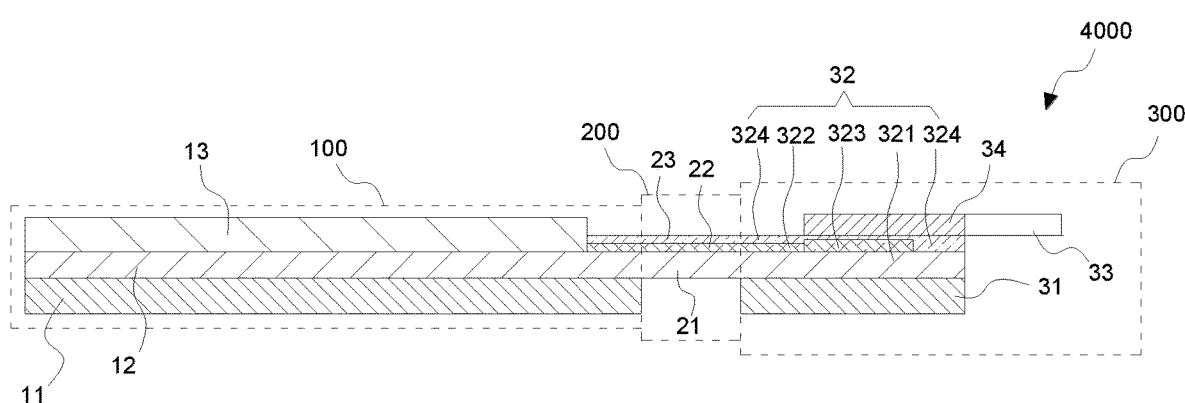
FIG. 9 is a structural schematic diagram of a cross-sectional view along line BB in FIG. 8.
Figure 10:
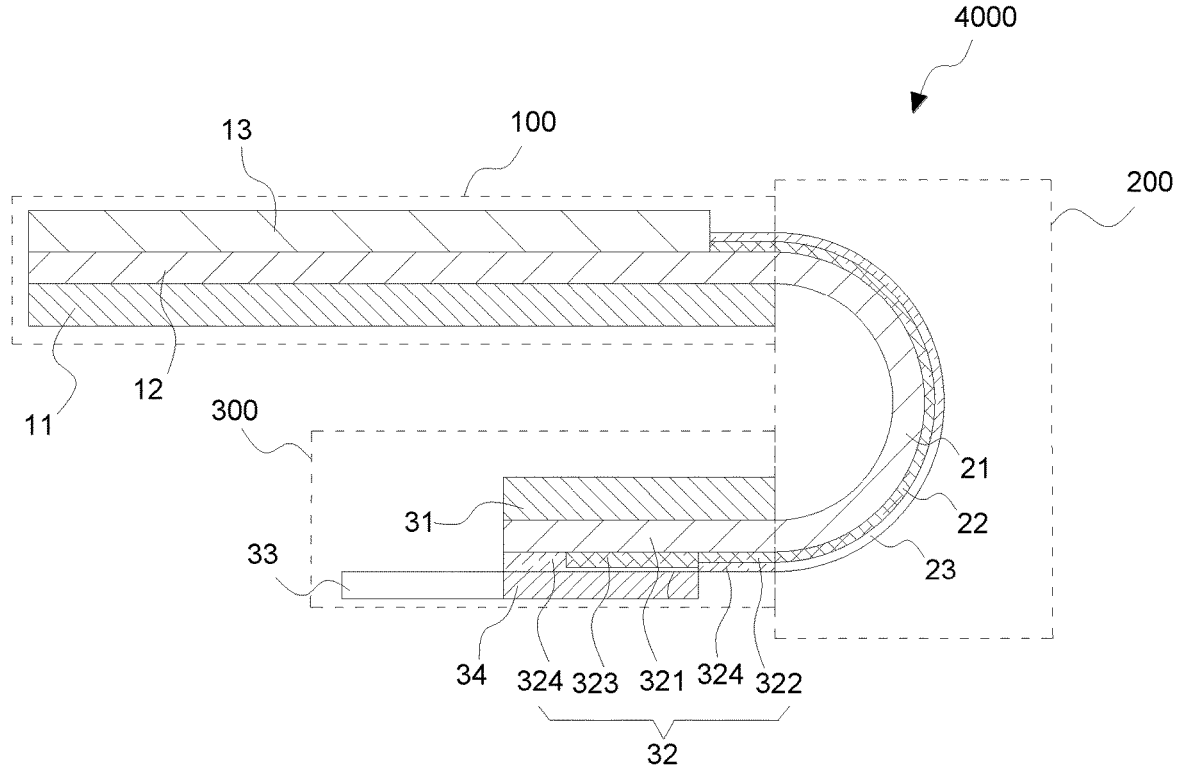
FIG. 10 is a structural schematic diagram of a cross-sectional view of the display panel provided by the fourth embodiment of the present application in a bending state.

Please refer to FIGS. 8-10. FIG. 8 is a structural schematic diagram of a top view of a display panel provided by a fourth embodiment of the present application in a flat state. FIG. 9 is a structural schematic diagram of a cross-sectional view along line BB in FIG. 8. FIG. 10 is a structural schematic diagram of a cross-sectional view of the display panel provided by the fourth embodiment of the present application in a bending state.

In the display panel 4000 of the fourth embodiment, the display panel 4000 includes a display portion 100, a bending portion 200, and a terminal portion 300. The bending portion 200 is connected between the display portion 100 and the terminal portion 300.

The terminal portion 300 includes a first backplate 31, a bonding substrate 32, a circuit board 33, and a thickening layer 34. The bonding substrate 32 is disposed on the first backplate 31. The circuit board 33 is disposed on the bonding substrate 32.

An orthographic projection of the first backplate 31 on a plane of the bonding substrate 32 is a first projection 31*a*. An orthographic projection of the circuit board 33 on the plane of the bonding substrate 32 is a second projection 33*a*.

The terminal portion 300 includes a first region 3*a*, a second region 3*b*, and a third region 3*c*. The first region 3*a* is an overlapping region of the first projection 31*a* and the second projection 33*a*.

In a first direction x, the second region 3*b*, the first region 3*a*, and the third region 3*c* are sequentially connected. The first direction x is parallel to a longitudinal direction of the first backplate 31. In addition, a second direction y is perpendicular to the first direction x.

Specifically, the second region 3*b* is connected to the first region 3*a* and is disposed on a side of the first region 3*a*. The third region 3*c* is connected to the first region 3*a* and is disposed on another side of the first region 3*a*.

The thickening layer 34 includes a first portion 341 and a second portion 342. The first portion 341 is disposed in the second region 3*b*. The second portion 342 is disposed in the third region 3*c*.

The first portion 341 extends from a junction of the first region 3*a* and the second region 3*b* to a side away from the first region 3*a*. The second portion 342 extends from a junction of the first region 3*a* and the third region 3*c* to a side away from the first region 3*a*.

A difference between the display panel 4000 of the fourth embodiment and the display panel 1000 of the first embodiment is that the thickening layer 34 is disposed on the bonding substrate 32.

Specifically, the first portion 341 and the second portion 342 are disposed on the bonding substrate 32 and connected to a boundary of the circuit board 33.

The display panel 4000 in the fourth embodiment disposes the thickening layer 34 corresponding to the second region 3*b* and the third region 3*c* on the bonding substrate 32, so as to reduce risks of wrinkling and buckling occurring to two opposite ends of the first backplate 31.

A structure of the display panel 4000 of the fourth embodiment is similar or same as a structure of the display panel 1000 of the first embodiment. For details, please refer to a content of the display panel 1000 of the first embodiment, which is not repeated herein.

Figure 11:
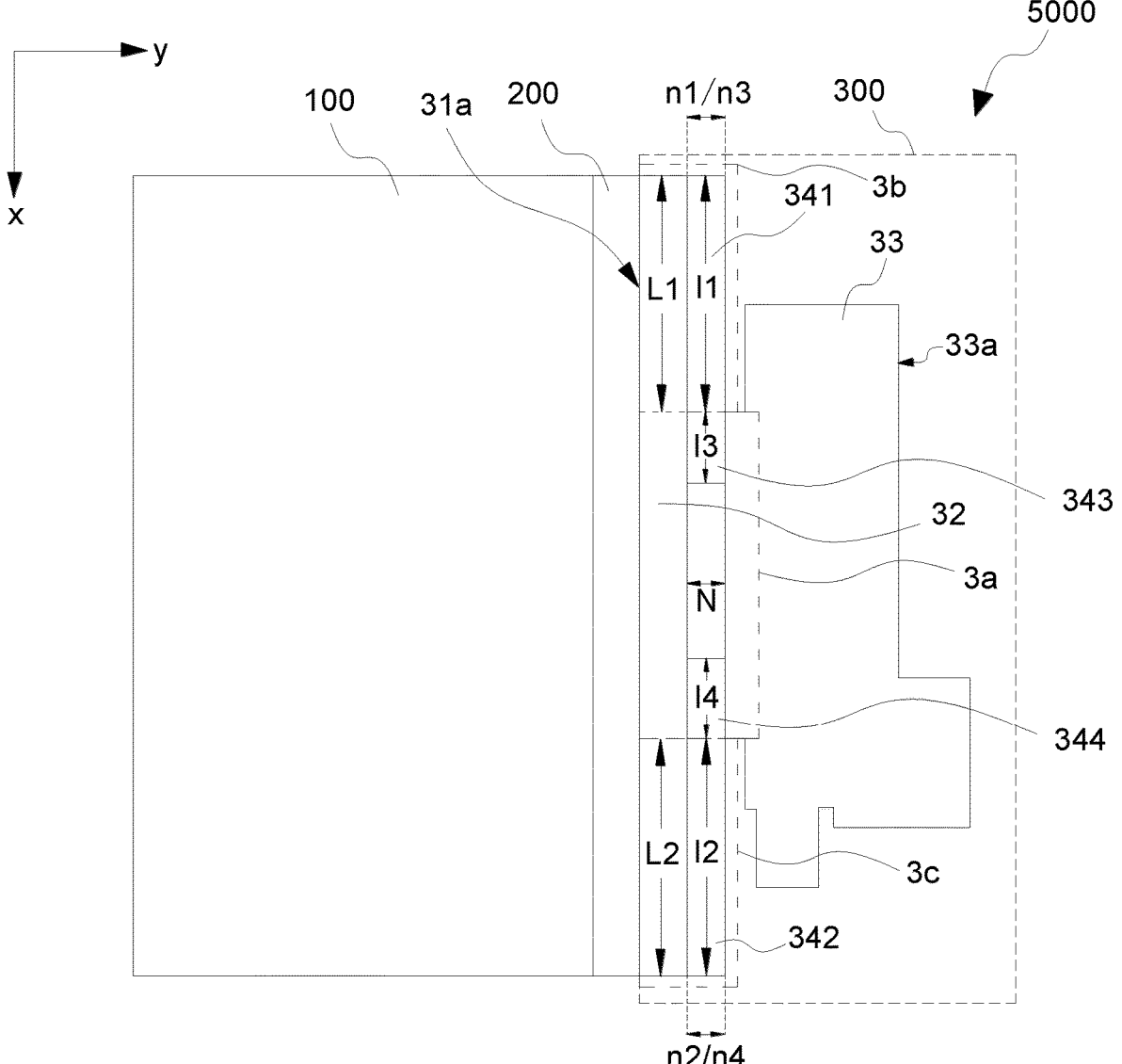
FIG. 11 is a structural schematic diagram of a top view of a display panel provided by a fifth embodiment of the present application in a flat state.

Please refer to FIG. 11. In a display panel 5000 of a fifth embodiment, the display panel 5000 of the fifth embodiment includes a display portion 100, a bending portion 200, and a terminal portion 300. The bending portion 200 is connected between the display portion 100 and the terminal portion 300.

The terminal portion 300 includes a first backplate 31, a bonding substrate 32, a circuit board 33, and a thickening layer 34. The bonding substrate 32 is disposed on the first backplate 31. The circuit board 33 is disposed on the bonding substrate 32. The thickening layer 34 is disposed on a surface of the first backplate 31 away from the bonding substrate 32.

An orthographic projection of the first backplate 31 on a plane of the bonding substrate 32 is a first projection 31*a*. An orthographic projection of the circuit board 33 on the plane of the bonding substrate 32 is a second projection 33*a*.

The terminal portion 300 includes a first region 3*a*, a second region 3*b*, and a third region 3*c*. The first region 3*a* is an overlapping region of the first projection 31*a* and the second projection 33*a*.

In a first direction x, the second region 3*b*, the first region 3*a*, and the third region 3*c* are sequentially connected. The first direction x is parallel to a longitudinal direction of the first backplate 31.

The thickening layer 34 includes a first portion 341, a second portion 342, a third portion 343, and a fourth portion 344. The first portion 341 is disposed in the second region 3*b*. The second portion 342 is disposed in the third region 3*c*. The third portion 343 is disposed in the first region 3*a*, and the third portion 343 is connected to the first portion 341. The fourth portion 344 is disposed in the first region 3*a*, and the fourth portion 344 is connected to the second portion 342. The third portion 343 is not connected to the fourth portion 344.

A difference between the display panel 5000 of the fifth embodiment and the display panel 2000 of the second embodiment is that the thickening layer 34 is disposed on the bonding substrate 32.

Specifically, the first portion 341 and the second portion 342 are disposed on the bonding substrate 32, and the third portion 343 and the fourth portion 344 are disposed on the circuit board 33.

The display panel 5000 in the fifth embodiment disposes the third portion 343 and the fourth portion 344 on the circuit board 33, so as to increase a suppression effect of the thickening layer 34 on the buckling occurring to two opposite ends of the first backplate 31.

A structure of the display panel 5000 of the fifth embodiment is similar or same as a structure of the display panel 2000 of the second embodiment. For details, please refer to a content of the display panel 2000 of the second embodiment, which is not repeated herein.

Figure 12:
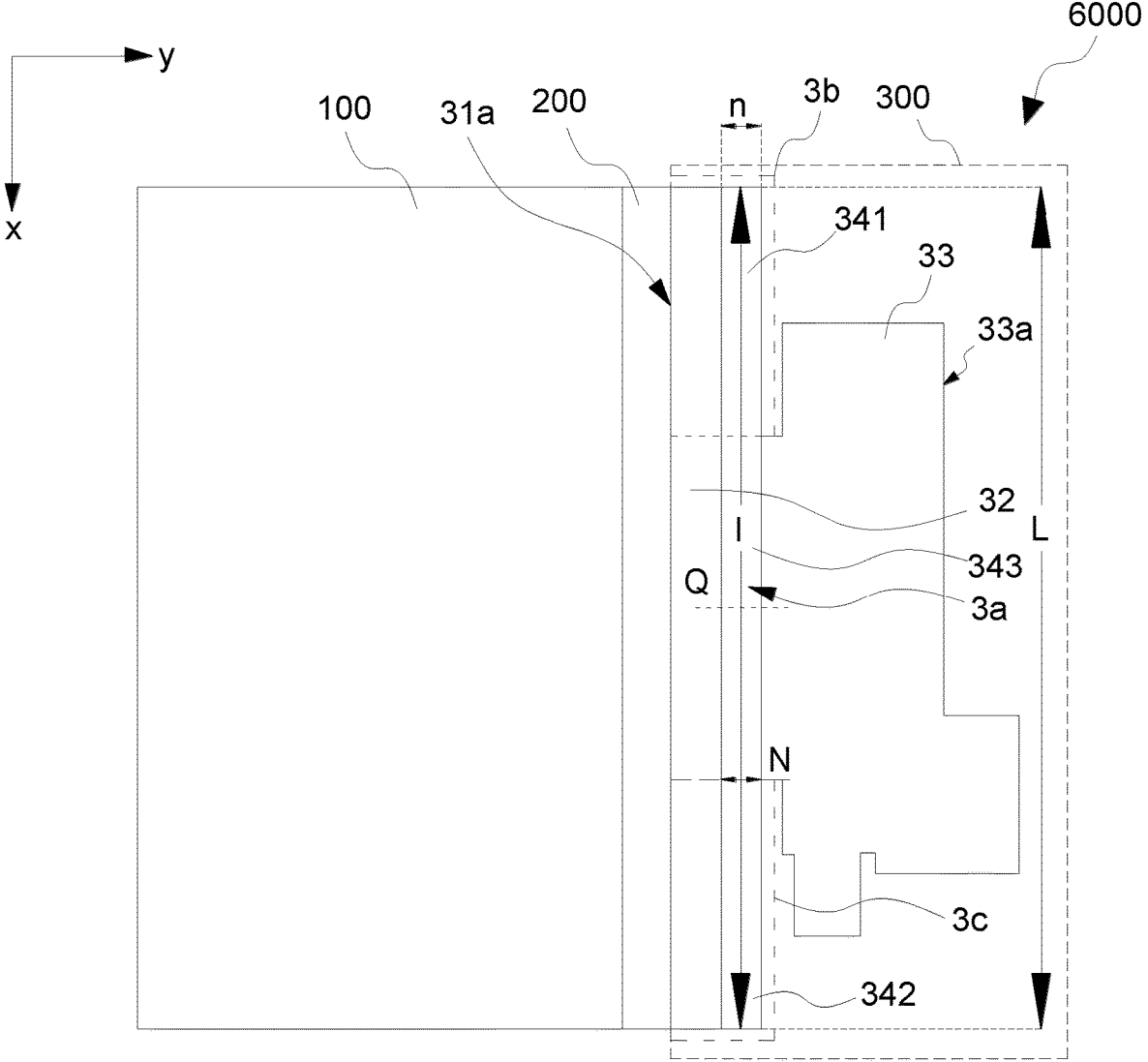
FIG. 12 is a structural schematic diagram of a top view of a display panel provided by a sixth embodiment of the present application in a flat state.

Please refer to FIG. 12. In a display panel 6000 of a sixth embodiment, the display panel 6000 of the sixth embodiment includes a display portion 100, a bending portion 200, and a terminal portion 300. The bending portion 200 is connected between the display portion 100 and the terminal portion 300.

The terminal portion 300 includes a first backplate 31, a bonding substrate 32, a circuit board 33, and a thickening layer 34. The bonding substrate 32 is disposed on the first backplate 31. The circuit board 33 is disposed on the bonding substrate 32. The thickening layer 34 is disposed on a surface of the first backplate 31 away from the bonding substrate 32.

An orthographic projection of the first backplate 31 on a plane of the bonding substrate 32 is a first projection 31*a*. An orthographic projection of the circuit board 33 on the plane of the bonding substrate 32 is a second projection 33*a*.

The terminal portion 300 includes a first region 3*a*, a second region 3*b*, and a third region 3*c*. The first region 3*a* is an overlapping region of the first projection 31*a* and the second projection 33*a*.

In a first direction x, the second region 3*b*, the first region 3*a*, and the third region 3*c* are sequentially connected. The first direction x is parallel to a longitudinal direction of the first backplate 31.

The thickening layer 34 includes a first portion 341, a second portion 342, and a third portion 343. The first portion 341 is disposed in the second region 3*b*. The second portion 342 is disposed in the third region 3*c*. The third portion 343 is disposed in the first region 3*a*, and the third portion 343 is connected to the first portion 341 and the second portion 342.

A difference between the display panel 6000 of the sixth embodiment and the display panel 3000 of the third embodiment is that the first portion 341 and the second portion 342 are disposed on the bonding substrate 32, and the third portion 343 is disposed on the circuit board 33.

The display panel 6000 in the sixth embodiment disposes the third portion 343 on the circuit board 33, so as to increase a suppression effect of the thickening layer 34 on the buckling occurring to two opposite ends of the first backplate 31.

A structure of the display panel 6000 of the sixth embodiment is similar or same as a structure of the display panel 3000 of the third embodiment. For details, please refer to a content of the display panel 3000 of the third embodiment, which is not repeated herein.

In the display panel provided by an embodiment of the present application, the thickening layer is disposed at least in the second region and/or the third region, so as to reduce risks of wrinkling and buckling occurring to the first backplate 31 during a bending process.

The display panel provided by the present application is described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A display panel, comprising a display portion, a terminal portion, and a bending portion connected between the display portion and the terminal portion;

wherein the terminal portion comprises:
    a first backplate;
    a bonding substrate disposed on the first backplate;
    a circuit board disposed on the bonding substrate; and
    a thickening layer comprising a first portion;
wherein an orthographic projection of the first backplate on a plane of the bonding substrate is a first projection, and an orthographic projection of the circuit board on the plane of the bonding substrate is a second projection;
wherein the terminal portion comprises a first region and a second region, and the first region is an overlapping region of the first projection and the second projection;
wherein in a first direction, the second region is connected to the first region and is disposed on a side of the first region, and the first direction is parallel to a longitudinal direction of the first backplate; and
wherein the first portion is disposed in the second region and extends from a junction of the first region and the second region to a side away from the first region.

2. The display panel according to claim 1, wherein the terminal portion further comprises a third region, and in the first direction, the third region is connected to the first region and is disposed on another side of the first region; and the thickening layer further comprises a second portion disposed in the third region, and the second portion extends from a junction of the first region and the third region to a side away from the first region.

3. The display panel according to claim 1, wherein the thickening layer further comprises a third portion disposed in the first region and connected to the first portion.

4. The display panel according to claim 2, wherein the thickening layer further comprises a fourth portion disposed in the first region and connected to the second portion.

5. The display panel according to claim 3, wherein the terminal portion further comprises a third region, and in the first direction, the third region is connected to the first region and is disposed on another side of the first region;

the thickening layer further comprises a second portion disposed in the third region, and the second portion extends from a junction of the first region and the third region to a side away from the first region; and the third portion is connected to the second portion.

6. The display panel according to claim 1, wherein a length of the first portion is less than or equal to a length of the second region.

7. The display panel according to claim 1, wherein a width of the first portion is less than or equal to a width of the first region.

8. The display panel according to claim 1, wherein from the junction of the first region and the second region to a direction away from the first region, a thickness of the first portion progressively decreases or remains constant.

9. The display panel according to claim 5, wherein a length of the thickening layer is less than or equal to a length of the first backplate.

10. The display panel according to claim 5, wherein a width of the thickening layer is less than or equal to a width of the first region.

11. The display panel according to claim 5, wherein in the first direction, from a center line of the first region to a direction away from the center line, a thickness of the thickening layer progressively decreases or remains constant.

12. The display panel according to claim 1, wherein the thickening layer is disposed on a surface of the first backplate away from the bonding substrate.

13. The display panel according to claim 12, wherein the thickening layer and the first backplate are an integrated structure.

14. The display panel according to claim 1, wherein the thickening layer is disposed on the bonding substrate.

15. The display panel according to claim 5, wherein the first portion and the second portion are disposed on the bonding substrate, and the third portion is disposed on the circuit board.

16. The display panel according to claim 5, wherein a width of the thickening layer is greater than a width of the first region and less than or equal to a width of the first backplate.

17. The display panel according to claim 1, wherein a width of the first portion is greater than a width of the first region and less than or equal to a width of the first backplate.

18. The display panel according to claim 2, wherein a width of the second portion is less than or equal to a width of the first region.

19. The display panel according to claim 3, wherein a width of the third portion is less than or equal to a width of the first region.

20. The display panel according to claim 4, wherein a width of the fourth portion is less than or equal to a width of the first region.

* * * * *